US011697766B2

(12) United States Patent
Andreaus et al.

(10) Patent No.: US 11,697,766 B2
(45) Date of Patent: Jul. 11, 2023

(54) METHOD FOR THE CONTROLLED REMOVAL OF A PROTECTIVE LAYER FROM A SURFACE OF A COMPONENT

(71) Applicant: INFICON GMBH, Bad Ragaz (CH)

(72) Inventors: Bernhard Andreaus, Rapperswil (CH); Claudio Christoffel, Chur (CH); Philip Spring, Frümsen (CH)

(73) Assignee: Inficon Holding AG, Bad Ragaz (CH)

( * ) Notice: Subject to any disclaimer, the term of this patent is extended or adjusted under 35 U.S.C. 154(b) by 433 days.

(21) Appl. No.: 16/630,775

(22) PCT Filed: May 14, 2018

(86) PCT No.: PCT/EP2018/062384
§ 371 (c)(1),
(2) Date: Mar. 17, 2020

(87) PCT Pub. No.: WO2019/011507
PCT Pub. Date: Jan. 17, 2019

(65) Prior Publication Data
US 2020/0224096 A1 Jul. 16, 2020

(30) Foreign Application Priority Data
Jul. 14, 2017 (EP) .................... 17181544

(51) Int. Cl.
*H01L 21/3105* (2006.01)
*C09K 13/06* (2006.01)
(Continued)

(52) U.S. Cl.
CPC ........ *C09K 13/06* (2013.01); *H01L 21/30604* (2013.01); *H01L 21/32133* (2013.01)

(58) Field of Classification Search
CPC ................. H01L 21/30604; H01L 21/31056
See application file for complete search history.

(56) References Cited

U.S. PATENT DOCUMENTS 4,726,104 A * 2/1988 Foster .................. B23K 35/224
29/889.1
5,687,679 A * 11/1997 Mullin ................. B82Y 30/00
123/41.72
(Continued)

FOREIGN PATENT DOCUMENTS

EP       0607939 A1   7/1994
JP     H0995772 A    4/1997
(Continued)

OTHER PUBLICATIONS

International Search Report and Written Opinion for related International Application No. PCT/EP2018/062384, dated Aug. 23, 2018; English translation of ISR provided (18 pages).
International Preliminary Report on Patentability for related PCT App No. PCT/EP2018/062384 dated Jan. 23, 2020, 21 pgs.

*Primary Examiner* — Thomas T Pham
(74) *Attorney, Agent, or Firm* — Procopio, Cory, Hargreaves & Savitch LLP

(57) ABSTRACT

A method 14 for the controlled removal of a protective layer 3 from a surface of a component 10, wherein the component comprises:
  a base body 1;
  an intermediate layer 2, which at least partially covers the base body; and
  said protective layer 3, which comprises an amorphous solid, in particular an amorphous nonmetal, in particular amorphous ceramic, and at least partially covers the intermediate layer;
wherein the method comprises the following steps:
  bringing 11 the protective layer 3 into contact with an etching or solvent medium 4; and
  removing 12 the protective layer 3 under the action of the etching or solvent medium 4 until the intermediate layer 2 is exposed;

(Continued)

and wherein the etching or solvent medium causes a first etching or dissolving speed of the protective layer and a second etching or dissolving speed of the intermediate layer and wherein the first etching or dissolving speed is greater than the second etching or dissolving speed. The invention furthermore relates to a method for replacing an old protective layer on a component, a method for operating a thin-film process facility, a component for use in a thin-film process facility, and a production method for the component.

15 Claims, 2 Drawing Sheets

(51) Int. Cl.
*H01L 21/306* (2006.01)
*H01L 21/3213* (2006.01)

(56) References Cited

U.S. PATENT DOCUMENTS

| | | | |
|---|---|---|---|
| 6,158,957 A * | 12/2000 | Marcin | F01D 5/005 415/200 |
| 7,232,492 B2 | 6/2007 | Won et al. | |
| 2004/0216667 A1 | 11/2004 | Mitsuhashi et al. | |
| 2007/0128877 A1 | 6/2007 | White | |
| 2010/0272142 A1 | 10/2010 | Fukuda | |
| 2013/0224432 A1* | 8/2013 | Hospach | C23C 14/083 427/446 |
| 2014/0322527 A1* | 10/2014 | Cho | C23C 16/45548 427/255.6 |

FOREIGN PATENT DOCUMENTS

| | | |
|---|---|---|
| JP | 2004134690 A | 4/2004 |
| JP | 2016042496 A | 3/2016 |
| JP | 2016208034 A | 12/2016 |

* cited by examiner

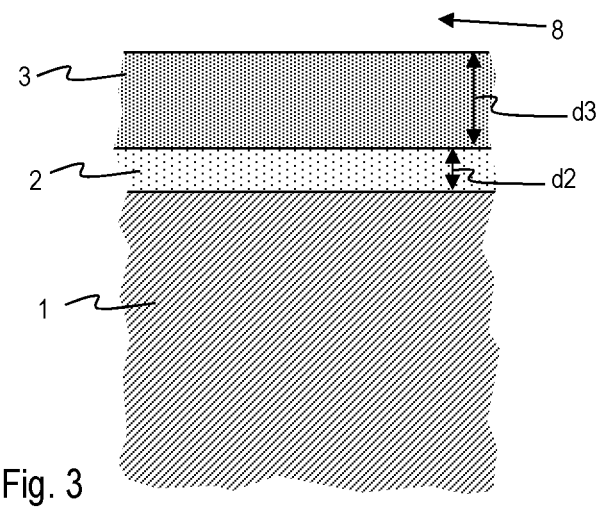
Fig. 3
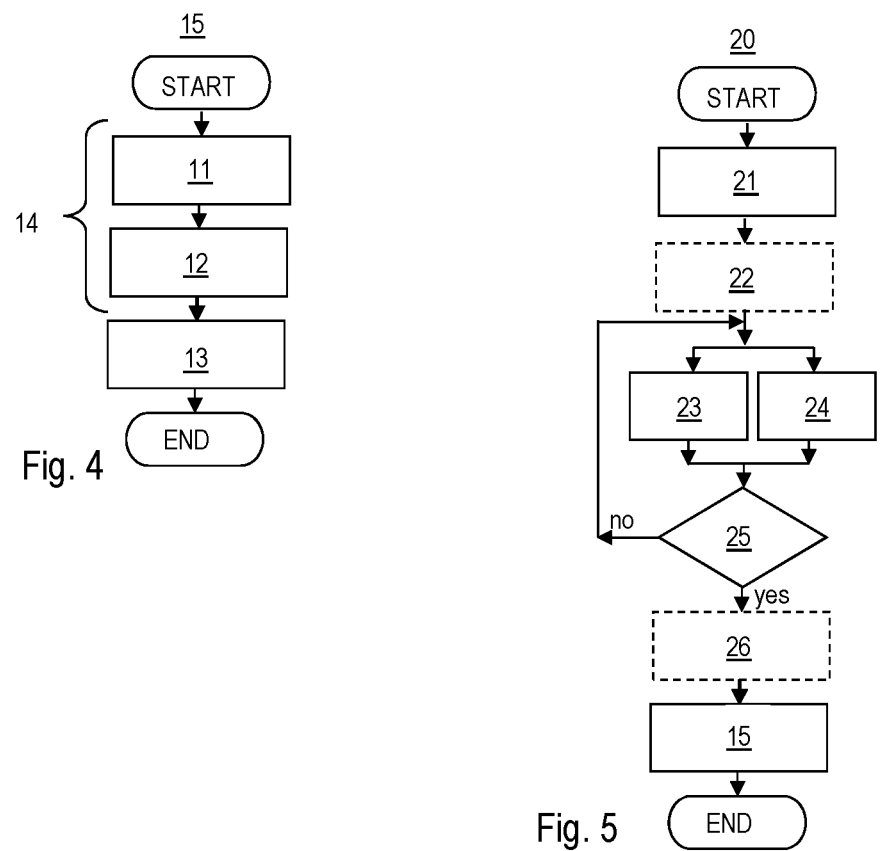
Fig. 4
Fig. 5

METHOD FOR THE CONTROLLED REMOVAL OF A PROTECTIVE LAYER FROM A SURFACE OF A COMPONENT

CROSS-REFERENCE TO RELATED APPLICATIONS

This application is a U.S. National Stage entry of PCT Application No: PCT/EP2018/062384 filed on May 14, 2018, which claims priority to EP Patent Application No. 17181544.2, filed Jul. 14, 2017, the contents of which are incorporated herein by reference.

The present invention relates to a method for the controlled removal of a protective layer from a surface of a component. The invention furthermore relates to a method for replacing an old protective layer on a component with a new protective layer, a method for operating a thin-film process facility having a component having a protective layer, a component for use in a thin-film process facility, and a production method for the component.

In various applications, components which are subjected to reactive process media are coated using a protective layer. Thus, for example, in the semiconductor industry, the components made of stainless steel or aluminum used in process chambers are provided with corrosion-resistant protective layers for protection from the process gases and plasmas, which are often very reactive. The accumulation of corrosion products on the wafers and undesired secondary reactions are thus to be prevented. Thus, for example, parts made of aluminum are anodized, so that a very chemically-resistant Al2O3 (aluminum oxide) protective layer results. Components made of stainless steel can be coated using Al2O3 in a method using chemical vapor deposition (CVD), to prevent the release of iron atoms or iron particles from the stainless steel.

Although the protective layer is distinguished in that it is much more stable in relation to the process media than the component to be protected, the service life of the protective layer is also usually limited. The protective layer is typically removed inhomogeneously under the influence of the process media. The risk of release of particles from the substrate of the component already exists under certain circumstances if the protective layer is removed at a critical point, whereby the end of the service life of the protective layer is reached. If the protective effect of the protective layer decreases, the entire component presently often has to be replaced. Although the protective layer permits a longer service life of the underlying part, the costs for the replacement of the complete component nonetheless result after the layer is partially worn off.

An extension of the service life of the protective layer by application of a new protective layer over the remainder of the still existing protective layer is often precluded. An increase of the total layer thickness of the protective layer at the points where protective layer is still present can negatively influence critical properties such as the adhesion of the protective layer on the substrate and the morphology of the protective layer. Negative effects of a thicker protective layer can be that the new overall layer has the tendency to fall off more, the protective effect decreases, and undesired particles result due to the protective layer parts which fall off.

The object of the present invention is to provide a method or a component which solves at least one problem of the prior art. A further object of the present invention is to enable a longer usage duration of components which are subjected to reactive process media.

This object is achieved according to the invention by a method according to Claim 1.

The method according to the invention is a method for the controlled removal of a protective layer from a surface of a component. Thereby, the component comprises:
  a base body;
  an intermediate layer which at least partially covers the base body; and
  said protective layer to be removed by the method, which comprises an amorphous solid, in particular an amorphous nonmetal, in particular amorphous ceramic, and at least partially covers the intermediate layer.

The method according to the invention comprises the following steps:
  bringing the protective layer into contact with an etching or solvent medium; and
  removing the protective layer under the action of the etching or solvent medium until the intermediate layer is exposed.

Thereby, the etching or solvent medium causes a first etching or dissolving speed of the protective layer and a second etching or dissolving speed of the intermediate layer, wherein the first etching or dissolving speed is greater than the second etching or dissolving speed.

The method according to the invention is applied to a component which comprises a base body in a protective layer, and wherein an intermediate layer is arranged between base body and protective layer which is etched more slowly in the etching medium used in the method than the protective layer.

The protective layer has the function of protecting the component from the reactive process medium, typically a gas or plasma, in a process chamber, in which workpieces are subjected to a removing process step. This function comes to bear during the service life of the component. The component is in particular not to be removed in comparison to the processed workpieces and is to have a long service life.

The etching or solvent medium can thus be an etching medium or a solvent medium. The etching medium can be liquid, for example, an etching solution, or it can be gaseous, for example, a plasma having etching-active particles or it can be an etching gas, for example, chlorine gas or fluorine gas. Alternatively to an etching medium, a solvent medium can be used in the scope of the present invention, which is capable of dissolving the protective layer. The dissolving speed is then accordingly the relevant property instead of the etching speed, i.e., the intermediate layer is dissolved more slowly by the solvent medium than the protective layer. The solvent medium can be liquid or gaseous. One possible solvent medium can be, for example, liquid water or water vapor. The term etching medium or solvent medium, respectively etching speed or dissolving speed, is also to be understood as the respective other term hereafter, if this is reasonable in context and it does not play a role whether it is an acid, basic, or neutral medium.

The intermediate layer has the function of protecting the base body from the etching medium (the etching solution, respectively the solvent medium) in the scope of the method according to the invention during the removal of the protective layer by the etching medium (respectively during the dissolving of the protective layer in the etching solution, respectively during the dissolving of the protective layer in the solvent medium). This function plays a central role in the method according to the invention for removing the protective layer at the end of the service life of the protective layer. The intermediate layer can be able to be etched sufficiently slower in the etching medium than the protective layer that, at the moment at which the protective layer is completely dissolved, the surface of the intermediate layer essentially still has the geometry of the original interface between protective layer and intermediate layer. The intermediate layer can additionally have the function of an adhesion promoter between base body and protective layer.

The intermediate layer and the protective layer are two layers, the etching or dissolving speed of which in the etching or solvent medium is different. This different etching or dissolving speed can be achieved in multiple ways. The intermediate layer and the protective layer can differ as follows:

in the chemical composition,
in the atomic near-order structure,
in the microstructure.

The atomic near-order structure can be defined, for example, by amorphous structure or crystalline structure. For example, the protective layer can have amorphous structure and the intermediate layer can have crystalline structure, with otherwise identical chemical composition. The atomic near-order structure can also be defined by various crystal structures in the case of TiO2, for example, rutile, anatase, and brookite structure. The microstructure can be defined, for example, by shape and size of crystals or by single-layer or multilayered layer structure.

The condition for the etching speeds can alternatively be described as follows: the combination of etching solution, protective layer, and intermediate layer is selected so that the etching solution has an etching selectivity of X:1 with respect to protective layer versus intermediate layer and wherein X is at least greater than 1. The etching selectivity can be, for example, greater than 10:1, i.e., X>10. X can also be greater than 100 or greater than 1000, which means that the intermediate layer is formed in such a way that it is substantially inert with respect to the removal procedure of the protective layer, so that the protective layer can be removed without negatively affecting the base body.

The greater the etching selectivity, the thinner the intermediate layer can be selected, without the risk existing that the intermediate layer could be etched away down to the base body during the removal or dissolving of the protective layer.

For example, gas distributor head, substrate holder, electrode, or heating plate come into consideration as components to which the method according to the invention can be applied. Furthermore, it is conceivable that gas lines or also entire process chambers are coated at least on their interior surface, which is subjected to the process gas, with a layer system made of intermediate layer and protective layer. I.e., the process chamber, in any case also together with its gas feeds, is itself the component having the intermediate layer and the protective layer.

The protective layer made of an amorphous solid, in particular an amorphous nonmetal, in particular an amorphous ceramic, has the advantage that it does not contain crystals which could come loose from the protective layer. The protective layer can be produced, for example, by atomic layer deposition (ALD). This method has the advantage that components having a complicated three-dimensional structure, for example, having through holes, can be coated in an unoriented manner with a defined number of atomic layers. For example, a gas distributor head (a so-called showerhead) as is used, for example, in process chambers for chemical vapor deposition, in particular for plasma-enhanced chemical vapor deposition (PE-CVD), is provided on all sides and also inside holes and cavities with a protective layer by means of atomic layer deposition. Atomic layer deposition is suitable for producing thin amorphous solid layers, in particular for producing thin amorphous solid layers of a nonmetal and in particular for producing thin amorphous layers from ceramic.

Bringing the protective layer into contact with the etching medium can be performed, in the case in which the etching medium is an etching solution, by wetting the protective layer with the etching solution. The wetting of the protective layer can be performed, for example, by spraying with etching solution or by partial or complete immersion of the component in etching solution.

The intermediate layer does not have to completely cover the base body. It is sufficient if the intermediate layer partially covers the base body. The etching solution is then only applied in the surface regions of the base body in which the base body is protected by the intermediate layer. This can be achieved, for example, by partial immersion in the etching solution. The protective layer does not have to completely cover the intermediate layer. In certain applications, it is sufficient for the protective effect if, in the case of a newly produced protective layer, the surface regions which are subjected to a reactive processing medium during the use in a process chamber are covered by the protective layer. The situation can also result after longer use of the component that the protective layer is removed at points by the action of reactive process media enough that it only still partially covers the intermediate layer. In particular in this situation, the method according to the invention is of great use, since it can prevent the damage to the base body by the etching medium at points having completely worn-off protective layer.

Intermediate layer and protective layer can be applied by means of various methods to the base body. In particular chemical vapor deposition (CVD), physical vapor deposition (PVD), and also spray coating come into consideration as methods for applying the intermediate layer and protective layer.

The method according to the invention has the advantage that the base body is essentially not attacked or changed during the removal of the old protective layer. In the case in which the material of the base body behaves similarly to the protective layer in the reaction with the removal chemistry, the base material would also be removed without the protective intermediate layer, whereby the original shape and/or the morphology of the component would be changed. In the method according to the invention, the intermediate layer reliably prevents the base body from damage due to the etching solution. In the case in which the base body consists of a metal or comprises a metal, a protective barrier between the etching medium and the metal is important, since typically the metal would be etched fastest if it came into contact with the etching medium.

A method is thus provided by the present invention, using which a protective layer can be removed in a controlled manner from a surface of a component.

Embodiments of the method according to the invention are defined by the features of Claims 2 to 9.

In one embodiment of the method, the removal of the protective layer under the action of the etching or solvent medium is carried out until the complete removal of the protective layer.

In one embodiment of the method, the etching or solvent medium is liquid and the method comprises the following steps:

wetting the protective layer using the liquid etching or solvent medium; and dissolving the protective layer in the liquid etching or solvent medium.

The two mentioned steps are implementations of the method steps of bringing the protective layer into contact with an etching medium and removing the protective layer using a liquid etching or solvent medium, which can be an etching solution, for example.

In one embodiment of the method, the intermediate layer comprises at least one metal, a metal oxide, in particular TiO2 (titanium oxide), ZnO (zinc oxide), Nb2O3 (niobium oxide), ZrO2 (zirconium oxide), Y2O3 (yttrium oxide), or Ta2O5 (tantalum oxide), a metal nitride, a metal carbide, a metal fluoride, a metal chloride, or a metal boride.

In one embodiment of the method, the intermediate layer comprises material provided in crystalline form.

In one embodiment of the method, the protective layer comprises at least one ply made of amorphous metal oxide, in particular amorphous Al2O3, amorphous metal nitride, amorphous metal fluoride, an amorphous metal chloride, amorphous metal carbide, or amorphous metal boride.

In one embodiment of the method, the protective layer comprises multiple plies, wherein adjoining plies differ in the chemical composition thereof.

In one embodiment of the method, the intermediate layer comprises a material which cannot be etched by the etching or solvent medium or consists of a material which cannot be etched by the etching medium.

In one embodiment of the method, the protective layer comprises amorphous Al2O3, the intermediate layer comprises at least one of TiO2, ZnO, Nb2O3, ZrO2, Y2O3, and Ta2O5, and the etching or solvent medium comprises at least one of
aqueous NaOH solution,
aqueous KOH solution,
aqueous NH4OH solution,
aqueous tetramethyl ammonium hydroxide solution,
aqueous H2O2 solution,
liquid H2O,
gaseous H2O.

Combinations of the features of the embodiments of the method are possible as desired, if not contradictory.

The present invention is furthermore also directed to a method according to Claim 10 or 11 for replacing an old protective layer on a component with a new protective layer.

The method according to the invention for replacing an old protective layer on a component with a new protective layer comprises the following steps: removing the old protective layer by way of the above-mentioned method according to the invention for removing a protective layer and applying the new protective layer.

The method for replacing an old protective layer on a component with a new protective layer has the advantage that the component can be reused over a plurality of service lives of the protective layer. The protective layer can be replaced multiple times without the underlying substrate also having to be replaced.

In one embodiment of the method, the application of the new protective layer is performed by atomic layer deposition (ALD).

A very homogeneous layer thickness of the protective layer is thus achieved, independently of the orientation of the surface to be coated.

The present invention is furthermore also directed to a method according to Claim 12 for operating a thin-film process facility.

It is a method for operating a thin-film process facility designed for layer removal from a workpiece. The thin-film process facility can be designed both for layer application to a workpiece and also for layer removal from the workpiece. The thin-film process facility has at least one process chamber. The process chamber or another component of the thin-film process facility comprises a protective layer. The method comprises the following steps:

provision of the process chamber or the other component with a base body, with an intermediate layer, which at least partially covers the base body, and with the protective layer, which comprises an amorphous solid, in particular an amorphous nonmetal, in particular amorphous ceramic, and at least partially covers the intermediate layer, wherein the intermediate layer contains at least one element which is not contained in the protective layer;

repeatedly, simultaneously carrying out the two steps
carrying out a removing process step using a process gas in the process chamber, wherein the protective layer comes into contact with the process gas; and
analyzing the process gas in the process chamber by means of an analysis method sensitive to the at least one element;

until the at least one element is detected in the process gas; and
replacing the protective layer on the process chamber or on the other component with a new protective layer by applying the above-described method according to the invention for replacing a protective layer.

One advantageous effect of the method for operating a thin-film process facility, which is designed for layer application (deposition) on workpieces and for layer removal (etching) from workpieces, is that it can be detected by way of the suitable selection of the intermediate layer according to the invention whether the protective layer has come to the end of its life. For example, if the material of the base body is aluminum and the protective layer is made of an aluminum compound, such as Al2O3, it can thus be established in situ by an intermediate layer made of another material, for example, TiO2 by chemical analysis for titanium in the process chamber whether the protective layer of the process chamber or another component has been completely removed at certain points and should thus to be replaced. This is only possible with difficulty in the case of Al2O3 layer on aluminum and the analysis for aluminum. Due to the use of this intermediate layer (containing TiO2 in the example) in combination with a detection device on the vacuum system for at least one element (in the example titanium) contained in this intermediate layer, for example, using a mass spectrometer, which can reliably search for titanium ions in our case, the end of life of the Al2O3 protective layer can be found out metrologically, i.e., as soon titanium ions are detected, the Al2O3 layer has to be replaced.

The invention furthermore relates to a component according to Claim 13 or 14 for use in a process chamber of a thin-film process facility.

The component according to the invention comprises
a base body,
an intermediate layer which at least partially covers the base body, and
a protective layer.

Thereby, the protective layer comprises an amorphous solid, in particular an amorphous nonmetal, in particular amorphous ceramic, and at least partially covers the intermediate layer. The protective layer can at least be etched or dissolved faster by a first etching or solvent medium than the intermediate layer, wherein the first etching or solvent medium belongs to the following group:
aqueous KOH solution,
aqueous NaOH solution,
aqueous NH4OH solution,
aqueous tetramethyl ammonium hydroxide solution,
aqueous H2O2 solution,
mixtures of the mentioned etching solutions,
liquid H2O,
gaseous H2O.

In one embodiment of the component, the protective layer comprises amorphous Al2O3 and the intermediate layer comprises at least one of TiO2, ZnO, Nb2O3, ZrO2, Y2O3, and Ta2O5.

The invention is still furthermore directed to a production method according to Claim 15.

It is a production method for a component according to the invention as described above. The production method comprises the following steps:
forming a base body,
applying an intermediate layer to the base body, and
applying a protective layer comprising an amorphous solid, in particular a protective layer comprising an amorphous nonmetal, in particular a protective layer comprising amorphous ceramic to the intermediate layer, wherein the protective layer can be etched faster at least by a first etching or solvent medium than the intermediate layer, wherein the first etching or solvent medium belongs to the following group:
aqueous KOH solution,
aqueous NaOH solution,
aqueous NH4OH solution,
aqueous tetramethyl ammonium hydroxide solution,
aqueous H2O2 solution,
mixtures of the mentioned etching solutions,
liquid H2O,
gaseous H2O.

The step of forming the base body can comprise, for example, milling, turning, drilling, welding, etc.

Returning to the composition of the layers, it can be stated that a variety of materials such as pure metals, oxides, nitrides, fluorides, and carbides can be used as an intermediate layer, if they ensure sufficient adhesion of the intermediate layer and the protective layer, are suitable for the process conditions, and have complementary properties in contact with the etching medium.

The materials for protective layer and intermediate layer can be selected matching with an etching or solvent medium, for example, according to the following combinations.

For example, the intermediate layer can comprise TiO2 or consist of TiO2, the protective layer can comprise amorphous Al2O3 or consist of Al2O3, and the etching medium can be in aqueous solution having 4 to 10 wt.-%, in particular 5 wt.-% NaOH. In this combination, the protective layer is etched faster than the intermediate layer.

For example, a TiO2 layer produced using atomic layer deposition (ALD) in 90° C. hot H2O as a solvent medium displays a service life approximately eight times longer than an Al2O3 layer of equal thickness produced using atomic layer deposition and therefore can be used as an intermediate layer for Al2O3-coated substrates.

For example, amorphous Al2O3 layers have an etching rate in the range of 0.5 nm/min at 25° C. in 10 M NH4OH solution, while layers made of Nb2O3 or Ta2O5 do not show any thickness change over 500 hours in the same solution. With the selection of 10 molar NH4OH etching solution at a temperature of 25° C. as an etching medium, a protective layer made of Al2O3 can thus be removed at reasonable speed. The intermediate layer can in this case consist of a material, Nb2O3 or Ta2O5, which cannot be etched by the etching medium.

The protective layer can consist, for example, of amorphous Al2O3 and the intermediate layer can consist of ZnO. Protective layer and intermediate layer can be deposited using ALD. The etching medium can be, for example, tetramethyl ammonium hydroxide solution.

Amorphous Al2O3 displays a selectivity greater by 400 times than ZnO deposited using ALD upon etching in a tetramethyl ammonium hydroxide solution having a pH of 12 and a temperature of the solution of 60° C.

The intermediate layer can consist, for example, of TiO2. The intermediate layer can be, for example, a multilayer nanolaminate made of alternating plies of TiO2 and Al2O3. TiO2, in particular also as a nanolaminate with Al2O3, offers a strong corrosion protection against NaOH and also against KOH in the range of 1 M solutions.

Exemplary embodiments of the present invention are also explained in greater detail hereafter on the basis of figures. In the figures FIG. 1 shows a flow chart of the method according to the invention for the controlled removal of a protective layer from a surface of a component;

FIG. 3 shows a schematic cross section through the layer structure of a component according to the invention for use in a process chamber of a thin-film process facility;

FIG. 4 shows a flow chart of the method according to the invention for replacing an old protective layer with a new protective layer;

FIG. 5 shows a flow chart of the method according to the invention for operating a thin-film process facility.

In one exemplary embodiment, the method step of bringing (11) into contact is implemented by wetting the protective layer using an etching solution and the method step of removing (12) the protective layer is implemented by dissolving the protective layer in the etching solution.

Figure 1:
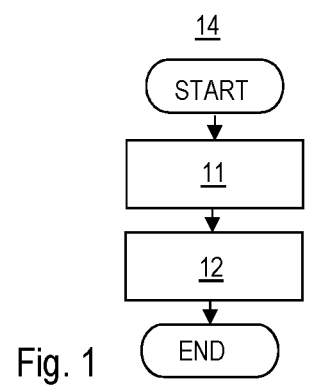
FIG. 1 shows in the flow chart the following two method steps
bringing (11) the protective layer into contact with an etching or solvent medium
removing (12) the protective layer under the action of the etching or solvent medium until the intermediate layer is exposed,
which are executed in succession on a component.
Figure 2:
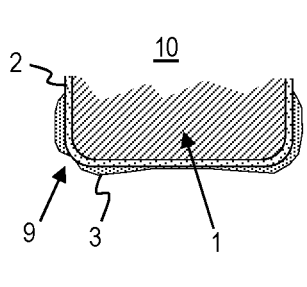
FIG. 2 shows, in partial figures FIG. 2.*a*) to 2.*d*), schematic cross sections through a part of a component for states before, between, and after method steps.
Figure 2:
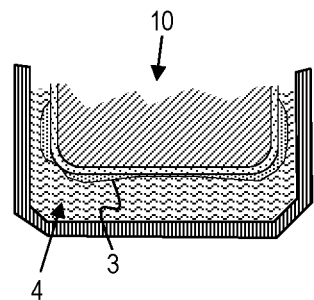
Figure 2:
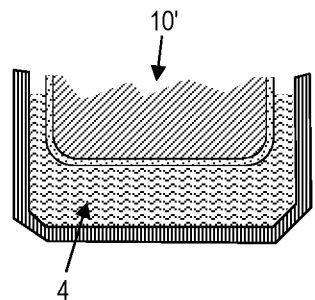
Figure 2:
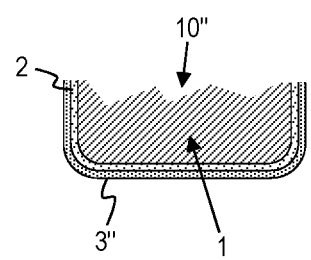

FIG. 2.*a*) shows a cross section through a surface-proximal region of a component 10. An intermediate layer 2, which is in turn partially covered by a protective layer 3, is applied to a base body 1 of the component. A state of the protective layer is illustrated by way of example as can result by inhomogeneous removal under the influence of a reactive process medium. At the point 9 identified with an arrow, the protective layer is worn off enough that the intermediate layer is exposed.

FIG. 2.*b*) shows the component 10 after the method step of bringing 11 the protective layer into contact with an etching medium. The embodiment variant is shown here of wetting the protective layer 3 using an etching solution 4 by at least partially immersing the component in the etching solution.

FIG. 2.*c*) shows the component 10' after the method step of removing 12 the protective layer under the action of the etching medium until the intermediate layer is exposed. The embodiment variant is shown here of dissolving the protective layer 3 in the etching solution. Because of the strongly differing etching speeds of the intermediate layer 2 and the protective layer 3, the intermediate layer 2 is left standing essentially unchanged. The base body 1 does not come into contact with the etching solution 4. FIG. 2.c) shows the state after complete removal of the protective layer.

FIG. 2.d) shows the component 10″ after the method step of applying 13 a new protective layer 3″, the last method step of the method for replacing an old protective layer with a new protective layer. The application of the new protective layer can be performed, for example, by atomic layer deposition, whereby a very homogeneous layer thickness of the protective layer can be achieved. In this state, the protective effect of the protective layer is ensured again and the component can be used in a thin-film process facility again, for example.

FIG. 3 shows a cross section through a surface-proximal region of a component. The protective layer 3 is in contact with the surroundings 8 of the component and rests on the intermediate layer 2. The intermediate layer 2 covers the base body 1 of the component and is located between protective layer 3 and base body. The protective layer 3 has a layer thickness d3. The intermediate layer 2 has a layer thickness d2. In one embodiment, the intermediate layer 2 consists of TiO2 and the protective layer 3 consists of amorphous Al2O3. Both intermediate layer and also protective layer can be applied by atomic layer deposition. Atomic layer deposition enables, for example, a layer thickness d2 of the intermediate layer to be selected in the range of 20-100 nm, for example, 50 nm thick, without the risk of holes or very thin points in the intermediate layer existing in this case. The protective layer is typically in the range of 90-500 nm, in particular 200-300 nm thick.

The thickness of the protective layer can be adapted depending on material, usage temperature, and intended application. Thick layers can spall more. Thick layers are more costly to produce, since the coating time increases linearly with the layer thickness.

An aqueous solution having 5% NaOH is used as an etching solution for removing the protective layer in the case of Al2O3 as the protective layer and TiO2 as the intermediate layer. The base body 1 consists, for example, of metal, in particular of aluminum, an aluminum alloy, or stainless steel.

FIG. 4 shows a flow chart of the method 15 for replacing an old protective layer on a component with a new protective layer. The sequence of the first two method steps 11, 12 corresponds to the method 14, as indicated by the bracket at the left edge of the flow chart. The method 15 is complete together with the method step of applying 13 the new protective layer. The application of the new protective layer can be executed, for example, by atomic layer deposition.

Furthermore, other methods of chemical vapor deposition, physical vapor deposition (PVD), and also spray coating come into consideration as methods for applying the new protective layer.

FIG. 5 shows a flow chart of the method 20 according to the invention for operating a thin-film process facility having a process chamber and a component. Firstly, the method steps of providing 21 the component with the layer structure as described above occur. Optionally, shown by a dashed frame, the installation 22 of a component in the process chamber follows, if the component is not the process chamber itself. In a loop, the method steps of carrying out 23 a removing process step and analyzing 24 the process gas are repeated, wherein the analysis 24 is performed simultaneously with carrying out 23 the removing process step. In the decision 25 "element detected?", the method follows the arrow "no" if the at least one element was not found in the step of analysis and the arrow "yes" if the element was detected. In the first case, the method steps 23 and 24 are repeated. In the latter case, the method 15 for replacing an old protective layer with a new protective layer subsequently follows, wherein optionally, shown by a dashed frame, the method step of removing 26 the component from the process chamber is performed beforehand, if the component is not the process chamber itself.

LIST OF REFERENCE SIGNS 1 base body
2 intermediate layer
3 protective layer
4 etching or solvent medium (respectively etching solution)
8 surroundings
9 point where protective layer is worn off
10 component
10′ component (after removal of the protective layer)
10″ component (with replaced protective layer)
11 method step of bringing the protective layer into contact with an etching or solvent medium
12 method step of removing the protective layer
13 method step of application
14 method for controlled removal of the protective layer
15 method for replacing an old protective layer with a new protective layer
20 method for operating a thin-film process facility
21 method step of providing
22 method step of installing the component
23 method step of carrying out a removing process step
24 method step of analyzing the process gas
25 deciding "element detected?"→yes/no
26 method step of removing the component
d2 layer thickness of the intermediate layer
d3 layer thickness of the protective layer
END end point of a method
START starting point of a method

The invention claimed is:

1. A method for operating a thin-film process facility, which is designed for layer removal from a workpiece, the facility having a process chamber, wherein the process chamber or an other component of the thin-film process facility comprises a protective layer, and wherein the method comprises:
   providing the process chamber or the other component with a base body, with an intermediate layer, which at least partially covers the base body, and with the protective layer, which comprises an amorphous solid, and at least partially covers the intermediate layer, wherein the intermediate layer contains at least one element which is not contained in the protective layer;
   repeatedly, simultaneously carrying out following two steps:
      carrying out a removing process step using a process gas in the process chamber, wherein the protective layer comes into contact with the process gas; and
      analyzing the process gas in the process chamber by an analysis method sensitive to the at least one element;
   until the at least one element is detected in the process gas; and
   replacing the protective layer on the process chamber or on the other component with a new protective layer by:
      removing an old protective layer by:

bringing the protective layer into contact with an etching or a solvent medium; and removing the protective layer under an action of the etching or solvent medium until the intermediate layer is exposed, wherein the etching or the solvent medium causes a first etching or dissolving speed of the protective layer and a second etching or dissolving speed of the intermediate layer, and wherein the first etching or dissolving speed is greater than the second etching or dissolving speed; and applying the new protective layer.

2. The method according to claim 1, characterized in that the removal of the protective layer under the action of the etching or the solvent medium is carried out until a complete removal of the protective layer.

3. The method according to claim 1, characterized in that the etching or the solvent medium is liquid, and the method further comprises:

wetting the protective layer using the liquid etching or the liquid solvent medium; and dissolving the protective layer in the liquid etching or the liquid solvent medium.

4. The method according to claim 1, characterized in that the intermediate layer comprises at least one of a metal, a metal oxide, a metal nitride, a metal carbide, a metal fluoride, a metal chloride, or a metal boride.

5. The method according to claim 4, wherein the metal oxide includes $TiO_2$, $ZnO$, $Nb_2O_3$, $ZrO_2$, $Y_2O_3$, or $Ta_2O_5$.

6. The method according to claim 1, characterized in that the intermediate layer comprises a material provided in crystalline form.

7. The method according to claim 1, characterized in that the protective layer comprises at least one ply made of amorphous metal oxide, amorphous metal nitride, amorphous metal fluoride, amorphous metal chloride, amorphous metal carbide, or amorphous metal boride.

8. The method according to claim 7, wherein the amorphous metal oxide includes amorphous $AlO_3$.

9. The method according to claim 1, characterized in that the protective layer comprises multiple plies, wherein adjoining plies differ in their chemical composition.

10. The method according to claim 1, characterized in that the intermediate layer comprises a material which cannot be etched by the etching or the solvent medium or consists of a material which cannot be etched by the etching or the solvent medium.

11. The method according to claim 1, characterized in that the protective layer comprises amorphous $Al_2O_3$, the intermediate layer comprises at least one of $TiO_2$, $ZnO$, $Nb_2O_3$, $ZrO_2$, $Y_2O_3$, and $Ta_2O_5$, and the etching or the solvent medium comprises at least one of:

an aqueous NaOH solution, an aqueous KOH solution, an aqueous $NH_4OH$ solution, an aqueous tetramethyl ammonium hydroxide solution, an aqueous $H_2O_2$ solution, a liquid $H_2O$, and a gaseous $H_2O$.

12. The method according to claim 1, wherein an application of the new protective layer is performed by atomic layer deposition.

13. The method according to claim 1, wherein the amorphous solid includes an amorphous nonmetal.

14. The method according to claim 13, wherein the amorphous nonmetal includes an amorphous ceramic.

15. The method according to claim 1, wherein the amorphous solid includes an amorphous nonmetal including an amorphous ceramic.

* * * * *